United States Patent [19]
Isaka et al.

[11] Patent Number: 6,080,030
[45] Date of Patent: Jun. 27, 2000

[54] LIGHT EMITTING DEVICE, ELECTRIC DEVICE PROVIDED WITH THE LIGHT EMITTING DEVICE, AND METHOD OF PRODUCING THE LIGHT EMITTING DEVICE

[75] Inventors: Kazuo Isaka; Masao Ueki; Akihiro Mouri; Kazunori Ueno, all of Tokyo, Japan

[73] Assignee: Canon Kabushiki Kaisha, Tokyo, Japan

[21] Appl. No.: 09/328,477

[22] Filed: Jun. 9, 1999

Related U.S. Application Data

[62] Division of application No. 08/685,505, Jul. 24, 1996, Pat. No. 5,936,347.

[30] Foreign Application Priority Data

Jul. 28, 1995 [JP] Japan ................................. 7-211425

[51] Int. Cl.$^7$ ................................................ H01J 9/00
[52] U.S. Cl. ............................................................ 445/24
[58] Field of Search ............................. 445/24; 313/506, 313/509, 512, 505, 498

[56] References Cited

U.S. PATENT DOCUMENTS

| | | | |
|---|---|---|---|
| 5,352,543 | 10/1994 | Ryu | 313/507 |
| 5,371,434 | 12/1994 | Rawlings | 313/509 |
| 5,384,517 | 1/1995 | Uno | 313/506 |
| 5,871,888 | 2/1999 | Heremans et al. | 430/321 |

FOREIGN PATENT DOCUMENTS 6275381  9/1994  Japan .

OTHER PUBLICATIONS

T. Nakayama, et al., "The Characteristics of Organic Light--Emitting Devices with an Optical Microcavity Structure", App. Phys. Lett. 63, No. 5, p. 594 (1993).

*Primary Examiner*—Nimeshkumar D. Patel
*Assistant Examiner*—Todd Reed Hopper
*Attorney, Agent, or Firm*—Fitzpatrick, Cella, Harper & Scinto

[57] ABSTRACT

The invention provides a light emitting device with a simple device structure capable of emitting light of various colors. The light emitting device can be produced by simple processing steps: A mold is pressed convex-and-concave against a glass substrate thereby forming a corresponding convex-and-concave structure on the glass substrate; a dielectric layer and a positive electrode layer are successively formed on the glass substrate, thereby forming a positive electrode substrate; a negative electrode substrate provided with a negative electrode layer formed thereon, is prepared; an active layer material is coated on the negative electrode substrate; and the positive and negative electrode substrates are bonded to each other via a spacer.

14 Claims, 4 Drawing Sheets

FIG. I
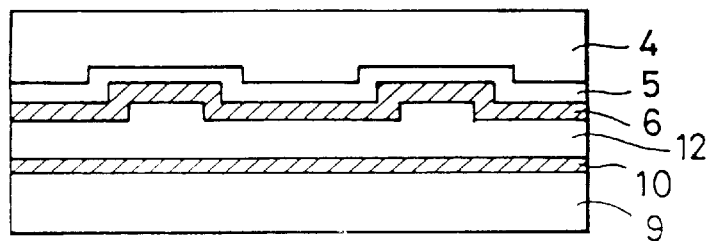
FIG. 2(a)
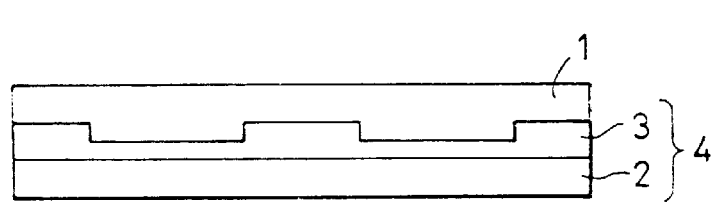
FIG. 2(b)
FIG. 2(c)
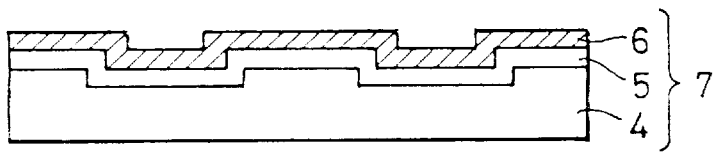
FIG. 2(d)
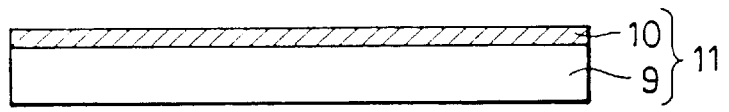
FIG. 2(e)
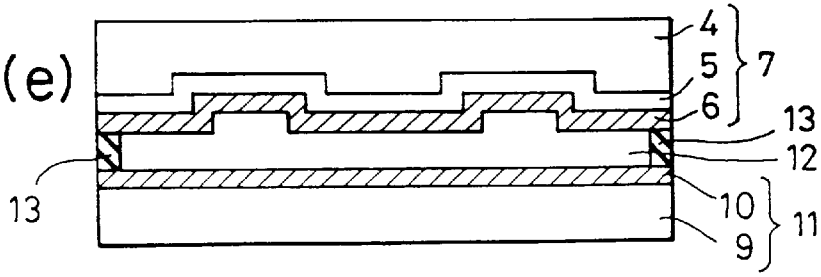

6,080,030

LIGHT EMITTING DEVICE, ELECTRIC DEVICE PROVIDED WITH THE LIGHT EMITTING DEVICE, AND METHOD OF PRODUCING THE LIGHT EMITTING DEVICE

This application is a division of application Ser. No. 08/685,505, filed Jul. 24, 1996, now U.S. Pat. No. 5,936,347, issued Aug. 10, 1999.

BACKGROUND OF THE INVENTION

1. Field of the Invention

The present invention relates to a light emitting device, an electric device provided with a light emitting device, and a method of producing the light emitting device. More specifically, the present invention relates to a light emitting device which can be applied to a light emitting display array or the like, and particularly to an electroluminescent light emitting device formed of an organic material. The present invention also relates to a display apparatus provided with the above light emitting device and electric devices such as a sensor device, exposure apparatus, and lighting apparatus. Furthermore, the present invention also relates to a method of producing the light emitting device.

2. Description of the Related Art

Organic electroluminescence using an organic material has various advantages over an inorganic electroluminescence. That is, organic electroluminescence devices can be realized in a flexible form, and their luminescence wavelength can be selected from a wide range. Furthermore, organic electroluminescence devices can easily be fabricated by means of a coating technique. Besides, large devices of this type can be easily produced at low cost. Another advantage is that organic electroluminescence devices can be driven by a low voltage. Consequently, there are intensive research and development activities on the organic electroluminescence.

Although electroluminescence devices have the advantage that they can emit light of various colors, it is difficult to realize a single electroluminescence device which can emit a plurality of colors. That is, it is required to form active layers into desired patterns using different materials corresponding to desired colors by means of evaporation or coating. However, very complicated production processing is required to form such a structure. Furthermore, it is difficult to realize a light emitting device in which the color of the emitted light varies from one small area to another small area.

It is also known in the art to form a plurality of light emitting layers corresponding to a plurality of desired colors. In this case, however, a complex layer structure is required. In another known technique, color filters are disposed on a single active layer which emits monochrome light. In this case, however, the color filters result in an increase in cost. Furthermore, light absorption by the color filters causes a reduction in the brightness and also causes degradation in color purity.

One known technique proposed to solve the above problems is to partially change the thickness of a transparent electrode made of ITO (indium tin oxide) so as to modify the optical path depending on the change in the thickness, thereby changing the wavelength of emitted light from one small area to another small area (The 41st Meeting of The Japanese Society of Applied Physics and Related Societies, 28P-N-16, 1994).

Although the above technique can provide means for partially changing the wavelength of emitted light within a single device, this technique has the disadvantage that the evaporation process has to be performed a plurality of times so as to control the thickness of the ITO layer. This causes an increase in complexity of the production process and also causes an increase in cost.

Furthermore, a pattern registration error occurs during a plurality of masking processes, and nonuniformity occurs in the conductivity of the ITO layer.

SUMMARY OF THE INVENTION

In view of the above, it is an object of the present invention to provide a light emitting device having a simplified structure which can be produced easily and which can emit light whose color varies within a signal device. It is another object of the present invention to provide a simple and low-cost production method for producing such a light emitting device. It is still another object of the present invention to provide a display apparatus provided with a light emitting device capable of emitting light whose color varies within a signal device.

According to one aspect of the present invention, there is provided a light emitting device including at least: a first substrate; a positive electrode layer formed on the first substrate; a second substrate; a negative electrode layer formed on the second substrate; and an active layer formed between the positive electrode layer and the negative electrode layer. Light emitting regions are formed between the positive and negative electrode layers in such a manner that the distance between the positive and negative electrode layers varies from one light emitting region to another region. One feature of the light emitting device is that a resin layer is disposed either between the first substrate and the positive electrode layer or between the second substrate and the negative electrode layer, so that the resin layer forms the light emitting regions in which the above-described distance varies.

According to another aspect of the present invention, there is provided an electric device including the light emitting device described above.

According to still another aspect of the present invention, there is provided a method of producing such a light emitting device, said method comprising the following steps: A resin layer is formed on either the first substrate or the second substrate, and a convex-and-concave structure is formed on the resin layer.

BRIEF DESCRIPTION OF THE DRAWINGS

FIG. 1 is a cross-sectional view schematically illustrating an embodiment of a light emitting device according to the present invention;

FIGS. 2(a)–2(e) are cross-sectional views schematically illustrating an example of a sequence of processing steps for producing the light emitting device according to the present invention;

DESCRIPTION OF THE PREFERRED EMBODIMENTS

Figures 3A, 3B:
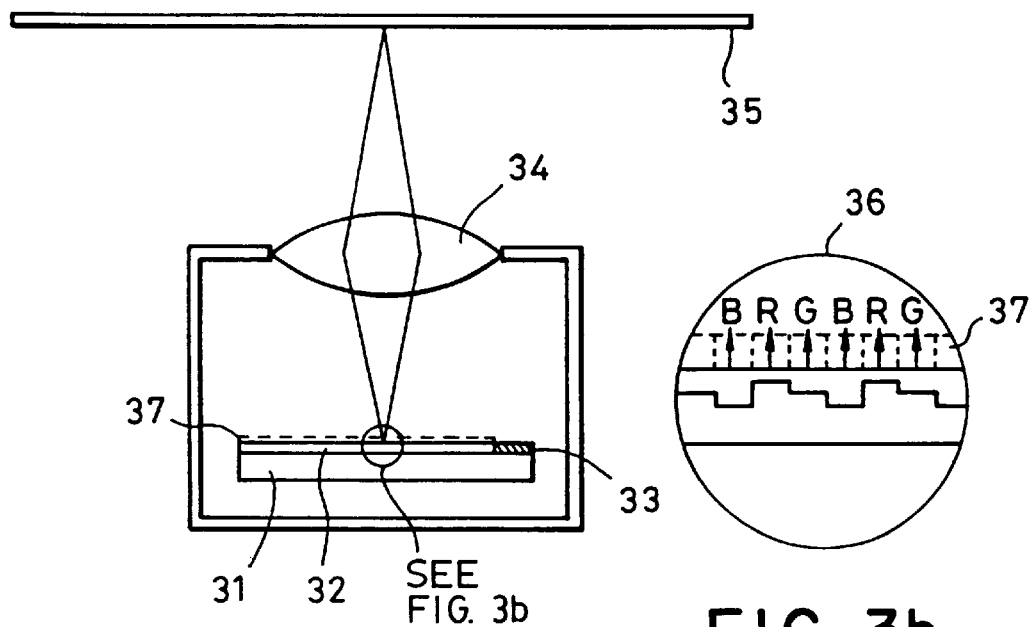
FIGS. 3a–3b are a schematic diagram of a preferred embodiment of a projection type display apparatus using the light emitting device according to the present invention.

FIG. 1 is a cross-sectional view illustrating a preferred embodiment of a light emitting device according to the present invention. As shown, the light emitting device includes: a glass substrate 4 having convex-and-concave regions formed on its surface; a dielectric layer 5; a positive electrode layer 6; a glass substrate 9; a negative electrode layer 10; and an active layer 12.

In the present invention, the positive electrode layer 6 is preferably made of an electrode material having a high work function. More specifically, in the case where the positive electrode 6 is opaque, preferable electrode materials include CuI, ITO, and $SnO_2$. On the other hand, the negative electrode layer 10 is preferably made of an electrode material having a low work function. Specific examples of preferable electrode materials for the negative electrode layer include Mg, Mg—Ag alloy, Na, Li, In, Al, and Au. In the present invention, the active layer 12 may consist of either a single layer or a plurality of layers. For example, the active layer 12 may have a hole injection layer into which holes are injected from the positive electrode layer 6, and may also have an electron injection layer into which electrons are injected from the negative electrode layer 10. In this case, either the hole injection layer or the electron injection layer may serve as a light emitting layer. Furthermore, a second light emitting such as a phosphor layer including a phosphor may also be formed between the hole injection layer and the electron injection layer. The active layer 12 may also be formed with a single layer including a mixture of various desired materials so that the single layer serves as a hole injection layer, an electron injection layer, and also a phosphor layer.

Furthermore, the active layer may have a multilayer structure consisting of: a light emitting layer made of a tris(8-quinolinolato)aluminum complex; and a layer of a triphenylamine derivative. The above light emitting layer may also be made of a beryllium complex, zinc complex, or the like.

Low-molecular-weight pigment materials such as various triphenylamine derivatives may be used to form the hole injection light emitting layer, and various oxadiazole derivatives may be employed to form the electron injection light emitting layer. Furthermore, various materials including conjugated polymer materials such as polyphenylene vinylene (PPV), and charge transfer polymer materials such as polycarbonate with a principal chain of triphenylamine derivative or polyvinyl carbazole may also be employed to form the active layer.

Although the present invention is particularly useful when it is applied to an organic light emitting device, the present invention may also be applied to an inorganic light emitting device. Furthermore, the present invention may also be applied to intrinsic electroluminescence devices such as a dispersion electroluminescence device or a thin film electroluminescence device, and also to injection type electroluminescence devices such as a light emitting diode.

In the light emitting device according to the present invention, as shown in FIG. 1, a dielectric layer is preferably disposed between the positive electrode layer 6 and the glass substrate 4. The dielectric layer can be formed to have a multilayer structure consisting of layers with different refractive indices such as a combination of $SiO_2$ and SiO so that the dielectric layer has high (or low) reflectance and/or transmittance at specific wavelengths. Or simply, a half mirror may also be employed to achieve a desired reflectance.

An example of a production sequence of the light emitting device according to the present invention will be describe below with reference to FIG. 2.

a) Production of a convex-and-concave mold 1 (FIG. 2(a)). First, a quartz glass plate serving as a mold material is cleaned. A silane coupling agent is then coated on the surface of the quartz glass plate, and a photoresist material is further coated thereon. The photoresist material may be either of a liquid type or a dry type formed into a sheet or film. When a dry film photoresist is employed, it is bonded to the quartz glass plate, as opposed to the liquid photoresist, which can be deposited by means of coating. In the case where a liquid photoresist is employed, it can be coated on by means of spraying, coating, or spinning. In particular, the spinning technique can provide good uniformity in thickness of the coated photoresist, which is highly desirable in the present invention. On the other hand, a dry photoresist can preferably be bonded to the surface of the glass plate by means of applying pressure or by means of applying both pressure and heat. If required, pre-baking is performed after forming the photoresist layer. Then the photoresist is exposed to light and developed so as to form a desired pattern in the photoresist. Post-baking is the performed as required to improve resistance to etching process. The exposed areas of the glass plate is then etched to a desired depth. The amount (depth) of etching can be controlled by controlling the etching time. After the etching, the photoresist is removed. If desired, the etching depth is measured to check whether the etching has been performed by the desired amount. The above processes including the application of a photoresist, exposure, development, etching, and resist removal are repeated a plurality of times corresponding to the desired number of levels of the multilevel pattern to be formed on the glass substrate. In this way, a desired convex-and-concave structure is formed on the surface of the glass plate and thus a complete convex-and-concave mold is obtained. The method of producing the convex-and-concave mold is not limited to the above-described technique. Other techniques such as patterning with a laser beam may also be employed to form a desired surface structure having convex and/or concave portions.

b) Production of a convex-and-concave glass substrate 4 (FIG. 2(b)). After performing silane coupling treatment as required, the surface of the glass substrate 2 is coated with an active energy radiation curing resin 3 such as an ultraviolet-curing resin. The various techniques described above in connection with the process of applying a photoresist material can also be employed for applying the resin 3. The convex-and-concave mold produced in the previous process is pressed against the resin 3 disposed on the glass substrate 2 so that a corresponding convex-and-concave structure is formed on the resin 3. Subsequently, the resin 3 is illuminated by an active energy radiation such as ultraviolet light via the glass substrate 2 and/or the convex-and-concave mold 4 so as to cure the resin 3. During the above pressing and/or curing process, the resin 3 may be heated as required. After curing the resin 3, the convex-and-concave mold 1 is removed. Thus, a convex-and-concave glass substrate 4 provided with a resin layer having a convex-and-concave structure transferred from the convex-and-concave structure of the mold 1 is obtained.

c) A dielectric layer 5 is formed, as required, on the convex-and-concave glass substrate 4, and a positive electrode layer 6 is formed thereon by means of, for example, evaporation. Thus, a positive electrode substrate 7 is obtained (FIG. 2(c)).

d) An negative electrode layer 10 is formed on another glass substrate 9 by means of, for example, evaporation, and is then patterned so as to produce a negative electrode substrate 11 (FIG. 2(d)).

e) Active layer materials are then deposited on the positive electrode layer 6. The negative electrode substrate 11 is placed on the positive electrode substrate 7 in such a manner that the negative electrode layer 10 comes in contact with the active layer. The negative electrode substrate 11 and the positive electrode substrate 7 are pressed against each other so that they are fixed to each other. In the above connection process, if required, a spacer 13 may be disposed between the negative electrode substrate 11 and the positive electrode substrate 7. Thus, a complete light emitting device according to the present invention is obtained (FIG. 2(e)).

In the present invention, as described above, the distance between the positive and negative electrode layers is controlled so as to construct an optical resonator cavity which can amplify and emit light with a specific wavelength.

The above-described technique of producing the convex-and-concave glass substrate 1 using the convex-and-concave mold 1 made of quartz glass can provide high productivity in mass production at low cost. However, if desired, the convex-and-concave mold 1 itself may also be employed as the convex-and-concave glass substrate.

An alternative technique for forming a multilevel convex-and-concave structure is to expose the ultraviolet-curing resin to ultraviolet light a plurality of times so that the variation in the curing degree produces a convex-and-concave structure having a desired depth. Instead of the ultraviolet-curing resin, a thermoset resin may also be employed. In this case, the coated thermoset resin is heated so that a desired convex-and-concave structure is obtained.

In the technique described above, two substrates are bonded to each other. However, the above structure may also be formed by depositing electrode layers and active layer on a single substrate. In this case, an active layer material is coated a plurality of times (for example, twice) on a substrate so that its thickness varies across the substrate, or otherwise an active layer material is coated so that its viscosity varies across the substrate, thereby achieving the variation in the distance between the two electrode layers.

In the above structure, if the distance d between the positive and negative electrode layers is set to satisfy the condition expressed by the following equation:

$$n \cdot d = \lambda \{(1/4)+(m/2)\}$$

(where m is an integer),
where n is the effective refractive index of the active layer, and $\lambda$ is the wavelength of emitted light, then light is emitted in a direction perpendicular to the substrate wherein the wavelength of the light varies depending on the variation in the distance d. The above distance d determining the wavelength $\lambda$ may be given by either the thickness of the active layer or the sum of the thickness of the active layer and the thickness of the phosphor layer. Although a small part of light can travel in an oblique direction toward a different wavelength region, such oblique light is weak compared to that emitted in the vertical direction, and thus it does not lead to a significant problem in practical applications. If desired, on the other hand, the device can also be adapted to emit a significantly large amount of oblique light by adjusting the optical path in such a manner as to suppress the light emission in the vertical direction.

SPECIFIC EMBODIMENTS

Embodiment 1

A light emitting device of the type shown FIG. 1 was produced according to the processing steps shown in FIGS. 2(a)–(e).

First, a convex-and-concave mold 1 was produced by forming a convex-and-concave structure on quartz glass by means of dry etching technique as will be described in greater detail below. That is, after cleaning the quartz glass plate, a silane coupling agent was coated on one surface of the cleaned quartz glass plate so as to perform a silane coupling treatment on the surface. A photo-curing photoresist material was spin-coated on the surface which had been subjected to the silane coupling treatment, and the photoresist material was pre-baked. After the pre-baking, the photoresist was selectively exposed to light so that only those areas at which protruded portions was to be formed were exposed to the light (exposure process). After the exposure, the photoresist was developed to form a desired pattern in the photoresist. The resultant photoresist was post-baked so as to improve resistance to the following etching process. The surface of the quartz glass plate was etched in a plasma gas ambient including halogen atoms. After completion of the etching, the photoresist was removed, and the amount of etching was measured. In this specific example, a one-level convex-and-concave structure was formed by the above process. An ultraviolet-curing resin 3 was coated on the surface of the glass substrate 2. The convex-and-concave mold 1 was then pressed against the ultraviolet-curing resin 3, and the ultraviolet-curing resin 3 was exposed to an ultraviolet light so as to cure the resin 3, thereby producing a convex-and-concave glass substrate 4. More specifically, the ultraviolet-curing resin 3 was spin-coated on the surface of the glass substrate 2 which had been cleaned. The convex-and-concave mold 1 was pressed against the glass substrate 2 so that the convex-and-concave surface came in contact with the ultraviolet-curing resin. The ultraviolet-curing resin was then cured to a sufficient degree by illuminating the convex-and-concave side by ultraviolet (UV) light. Then, the convex-and-concave mold 1 was removed and thus the convex-and-concave glass substrate 4 was obtained.

$TiO_2$ and $SiO_2$ were evaporated successively on the convex-and-concave glass substrate 4, thereby forming a dielectric layer 5. Subsequently, ITO was evaporated thereon so as to form a positive electrode layer 6. Thus, a positive electrode substrate 7 was obtained.

Another glass substrate 9 was cleaned and dried. Indium was then evaporated on one surface of the glass substrate 9 so that the evaporated surface could reflect all incident light of wavelengths relevant to operation of the device. The indium was patterned so as to form a negative electrode layer 10. Thus, a negative electrode substrate 11 was obtained.

An active layer 12 capable of emitting light of two different colors was then formed on the convex-and-concave surface of the positive electrode substrate 7 by spin-coating THF (tetrahydrofuran solution containing poly(N-vinylcarbazole) mixed with dispersed tetraphenylpentadiene (blue, PL=460 nm) and N,N-dimethoxyphenyl-N-(naphthostyryl)amine (blue, PL=435 nm), with the coated film levelled so as to obtain a flat surface.

The positive electrode substrate 7 and the negative electrode substrate 11 were pressed against each other so as to obtain a light emitting device in which an optical cavity was formed between the positive electrode layer 6 and the negative electrode layer 10. In this specific embodiment, the distance between the positive and negative electrode layers was adjusted to be equal to (¾)λ. The distance between the bottom and top of the convex-and-concave structure was set to 30 nm.

When a voltage of 10 V was applied between the positive and negative electrode layers of the obtained light emitting device, the device successfully operated and emitted blue (460 nm) and green (530 nm) light corresponding to the convex-and-concave structure of the convex-and-concave glass substrate 4.

Although the convex-and-concave structure was formed on the positive electrode substrate in the specific embodiment described above, the convex-and-concave structure may also be formed on the negative electrode substrate to achieve a similar function.

Furthermore, although a mixture of two different materials was used to form the active layer in the above specific example, the active layer may also be formed of a material exhibiting a broader emission wavelength band (for example, tris(8-quinolinolato)aluminium). Or otherwise, the active layer may also be formed in such a manner as to have a multilayer structure.

Embodiment 2

Using similar processes to those employed in Embodiment 1, a three-level convex-and-concave structure was formed on a substrate so as to obtain a light emitting device substrate capable of emitting three RGB colors. An optical system consisting of a condenser lens 34 was combined with the above light emitting device substrate so as to produce a projection type display apparatus, which is schematically shown in FIG. 3. In FIG. 3, reference numeral 31 denotes the light emitting device including the light emitting portion 32 and the driver portion 33.

In this display apparatus, the light emitted by the light emitting portion 32 illuminates via the condenser lens 34 a screen 35 serving as a display member so as to display an image corresponding to an image pattern formed on the light emitting device 31. In this light emitting device 31, since three RGB colors are created by means of the convex-and-concave structure as shown in the insert 36, it is possible to form a color image without having to use color filters. The image can be displayed by properly turning on and off liquid crystal shutters 37 (represented by broken lines in FIG. 3) disposed on the condenser-lens side of the light emitting device substrate 31 so as to control the transmission of light through the liquid crystal shutters 37 corresponding to pixels serving as R-, G-, and B-light emitting regions. An alternative technique to display an image is to employ a structure in which both positive and negative electrode layers are formed into stripe shapes which cross each other. With this arrangement, it is possible to select desired pixels and emit light from the selected pixels.

Embodiment 3

In the light emitting device according to the present invention, since an optical resonant cavity is formed with a pair of electrodes, it is possible to emit light with various wavelengths depending on the distance between the two electrodes. However, in this structure, light is emitted to the outside in a direction perpendicular to the electrode layers, and thus the light is difficult to be seen from an oblique direction. This can produce a problem of a rather narrow angle of view.

Figure 4:
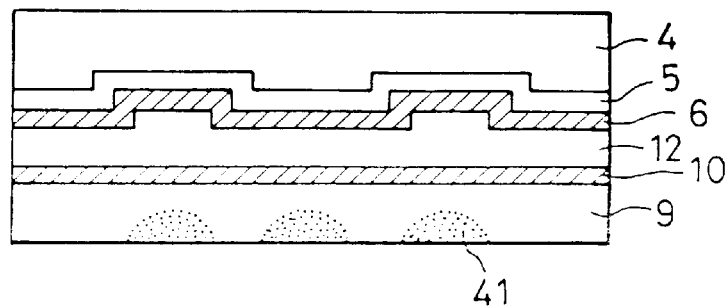
FIGS. 4–6 are cross-sectional views schematically illustrating various structures of the light emitting device according to the present invention, which can preferably be employed in a display apparatus.

In this specific embodiment, the above problem is avoided by employing a structure in which the materials for the positive and negative electrode layers of the structure employed in Example 1 are replaced by each other (so that the negative electrode layer is transparent to light and thus light is emitted to the outside from the side of the substrate 9), and in which ions are implanted into the substrate 9 so as to produce a refractivity distribution thereby producing micro-lenses 41 within the substrate. FIG. 4 is a cross-sectional view illustrating the structure of the light emitting device according to the present embodiment. In this embodiment, a parallel light ray emitted via the negative electrode layer 10 is diverged by the micro-lenses 41, thereby ensuring that the light can be easily seen even from oblique directions.

Figure 5:
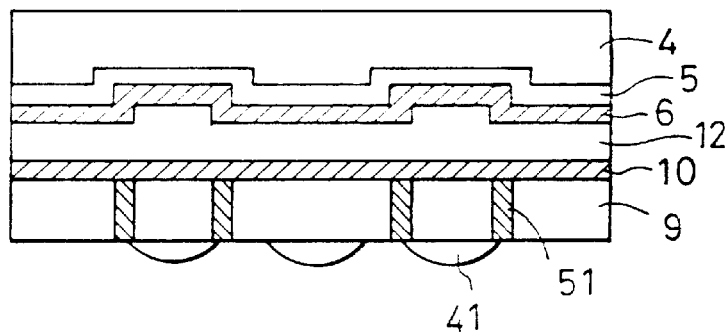
Figure 6:
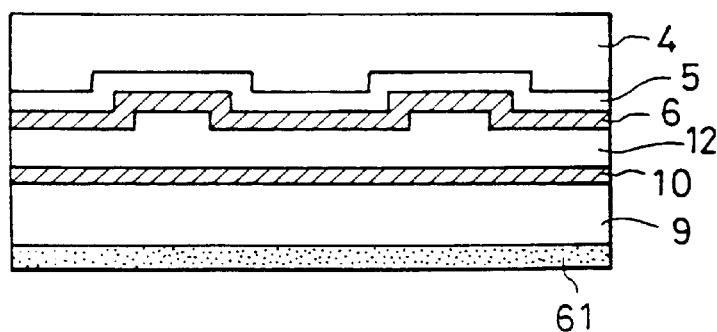

An alternative technique of forming micro-lenses is to coat an ultraviolet-curing resin on the outer surface of the substrate 9 and then expose the ultraviolet-curing resin to ultraviolet light in such a manner that specific regions of the ultraviolet-curing resin corresponding to a desired pattern are exposed to the ultraviolet light thereby producing a corresponding convex-and-concave structure which serves as the micro-lenses 41. FIG. 5 illustrates such the structure. A similar structure may also be produced by pressing a plate having an adequate convex-and-concave structure on its surface against a resin disposed on the substrate 9. In this specific embodiment, partition walls 51 are disposed in the substrate 9 so as to isolate the respective pixels from each other, thereby preventing interference with the light with different wavelengths emitted by adjacent pixels. This makes it possible to obtain a display apparatus capable of displaying an image with high-purity colors. The isolation between pixels may also be realized by forming a light blocking pattern having openings at locations corresponding to the respective pixels. Such the light blocking pattern may be formed by means of for example a thick-film printing technique.

Embodiment 4

Figure 7:
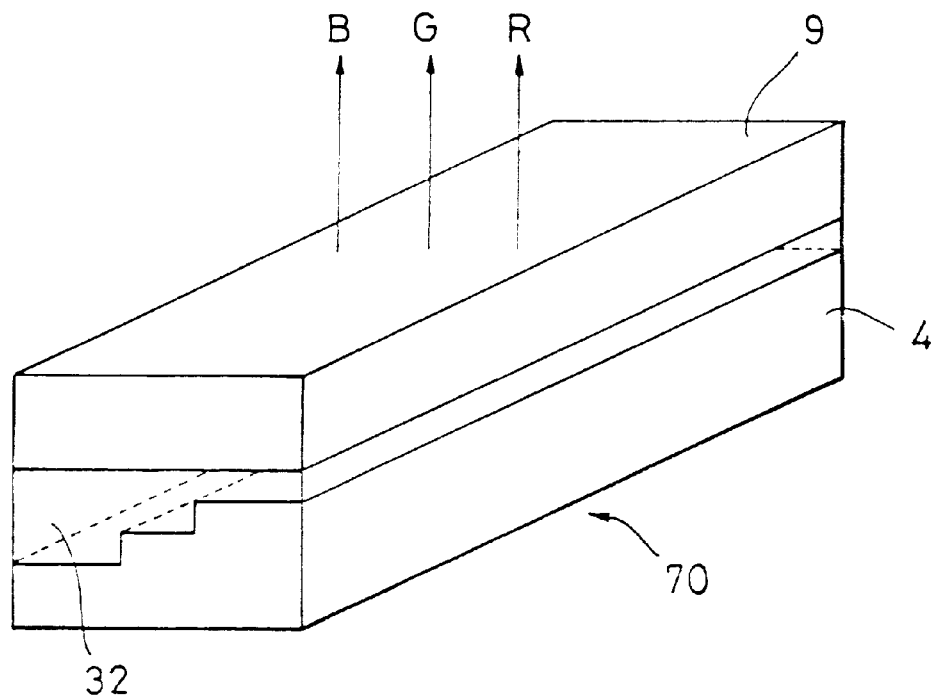
FIG. 7 is a perspective view schematically illustrating an embodiment of a light emitting device having stripe-shaped light-emitting portions for emitting various colors, according to the present invention.

In this specific embodiment, the micro lenses employed in the previous specific embodiment are replaced by particles by which light is properly scattered. FIG. 7 is a cross-sectional view illustrating the device structure of the present embodiment.

In this specific embodiment, an ultraviolet-curing resin mixed with particles is coated on the outer surface of the negative electrode substrate 11, and then cured so as to form a particle-mixed layer 61 serving as a light scattering layer.

When a voltage is applied between the electrodes of the light emitting device of the present embodiment, light is emitted toward the outside in a direction perpendicular to the negative electrode layer 10, and scattered by the particle-mixed layer 5, thereby ensuring that the light can easily be seen even from oblique directions. Thus, it is possible to realize a display apparatus having a wide view angle.

In the specific examples 3 and 4 described above, the light emitting device is formed to have a structure which can emit two different colors. However, the light emitting device may also be formed in such a manner as to emit three different colors by forming three-level convex-and-concave structure and forming the active layer with a mixture of materials which can emit three different colors or with a material having a broad light emission characteristic including wavelengths corresponding to three desired colors.

Furthermore, although the optical resonant cavity is formed between the two electrodes in the above embodiments, the optical resonant cavity may also be realized by forming a reflecting layer on the outside and properly controlling the thickness.

Embodiment 5

A line head having three stripe-shaped light emitting regions (corresponding to three colors) each including circular pixels is presented in this embodiment. Since the light emitted by this line head is limited to a vertical direction, it is possible to form a exposed dot on a silver salt film so that the diameter of the exposed dot becomes substantially equal to the diameter of the pixel. Thus, cells for focusing light onto a photosensitive layer are no longer necessary in this line head of the invention, as opposed to conventional types. In this line head, a great number of circular-form pixels are disposed along three lines. The line head 70 includes a convex-and-concave substrate 4 having stripe-shaped steps corresponding to the three lines of pixels which are formed in a manner similar to the previous embodiments so that three lines of dots can emit three different colors. A photosensitive film or the like is disposed in parallel to and adjacent to the light emitting surface. As shown in FIG. 7, the light emitted by the line head includes substantially only a vertical component. This makes it possible to form exposed dots on a photosensitive layer such as a photosensitive film such that each dot exactly corresponds to each pixel of the line head, without having to use focusing means. Thus it is possible to realize a high-speed and high-resolution color exposure apparatus.

If partition walls such as those employed in the embodiment shown in FIG. 5 are formed in the line head of the present embodiment, the performance of the line head can be improved.

In a modified mode, the line head may also be realized in such a form in which pixels disposed along one line so that the color varies periodically from pixel to pixel.

Embodiment 6

Figure 8:
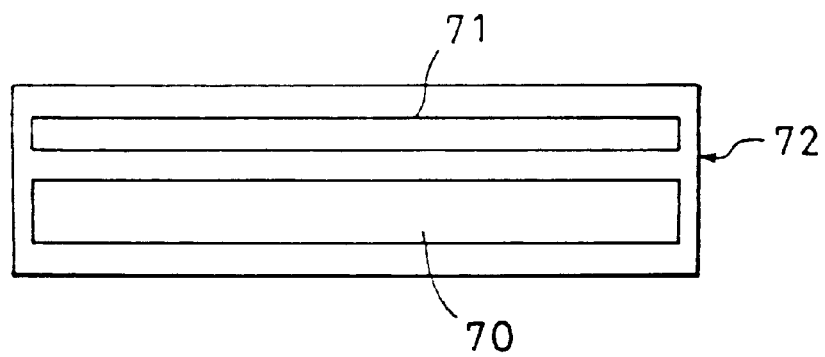
FIG. 8 is a schematic diagram illustrating an embodiment of a sensor device including a light emitting device with stripe-shaped light emitting regions and also including reading means, according to the present invention.

The light emitting device 70 of Embodiment 5 can be combined with a sensor 71 into an integral form so as to realize a sensor device as shown in FIG. 8. This sensor device may be employed in for example a low-cost color scanner. In this sensor device, the light emitting device 70 serves as illumination means. If desired, the light emitting device 70 may be disposed separately from the sensor 71. A non-single crystal semiconductor layer such as an amorphous silicon layer may preferably be employed to form long sensing portions on the sensor 71.

As described above, the present invention provides a light emitting device which can emit various colors without having to use color filters or the like. The light emitting device of the invention can be produced by simple processes and thus can be mass-produced at a low cost.

The light emitting device may also be employed as a color back light combined with a liquid crystal layer serving as a transmission modulation device thereby realizing a high-efficiency color display having no color filters.

What is claimed is:

1. A method of producing a light emitting device, said light emitting device including at least: a first substrate; a positive electrode layer formed on said first substrate; a second substrate; a negative electrode layer formed on said second substrate; and an active layer formed between said positive electrode layer and said negative electrode layer, wherein light emitting regions are formed between said positive and negative electrode layers in such a manner that the distance between said positive and negative electrode layers varies from a light emitting region to another region; said method comprising the steps of:

forming a resin layer on either said first substrate or said second substrate; and forming a convex-and-concave structure on said resin layer.

2. A method of producing a light emitting device, according to claim 1, wherein said step of forming the convex-and-concave structure includes the step of pressing a mold member having a convex-and-concave structure against the resin layer to form the structure.

3. A method of producing a light emitting device, according to claim 1, wherein said step of forming the resin layer includes the step of curing said resin by applying either light or heat to said resin.

4. A method of producing a light emitting device, according to claim 1, wherein said mold member is formed by means of etching.

5. A method of producing a light emitting device, according to claim 3, wherein said application of light or heat is performed while pressing said mold member having the convex-and-concave structure during said step of forming the convex-and-concave structure on the resin layer.

6. A method of producing a light emitting device, according to claim 1, wherein said resin layer is applied onto either said first substrate or said second substrate by means of spin-coating.

7. A method of producing a light emitting device, according to claim 1, wherein said resin layer is applied to either said first substrate or said second substrate by means of bonding.

8. A method of producing a light emitting device, according to claim 1, wherein, after completion of said step of forming the convex-and-concave structure, said positive electrode layer or said negative electrode layer is formed.

9. A method of producing a light emitting device, according to claim 4, wherein said etching is dry etching.

10. A method of producing a light emitting device, according to claim 4, wherein said formation of the convex-and-concave structure by means of etching is performed using a photosensitive resin.

11. A method of producing a light emitting device having an organic light emitting layer between a positive electrode layer and a negative electrode layer comprising the steps of:

preparing a resin layer having a convex-and-concave structure disposed on a first substrate;

forming one of said positive electrode layer and said negative electrode layer on said resin layer;

forming the other electrode layer on a second substrate;

disposing said organic light emitting layer between said positive and negative electrode layers; and implanting ions into one of said first and second substrates so as to produce a refractivity distribution thereby producing micro-lenses.

12. A method of producing a light emitting device according to claim 11, wherein said step of preparing the resin layer having the convex-and-concave structure disposed on the first substrate includes the step of pressing a mold member having a convex-and-concave structure against the resin layer to form the structure.

13. A method of producing a light emitting device having an organic light emitting layer between a positive electrode layer and a negative electrode layer comprising the steps of:

preparing a first resin layer having a convex-and-concave structure disposed on a first substrate;

forming one of said positive electrode layer and said negative electrode layer on said first resin layer;

forming the other electrode layer on a second substrate;

disposing said organic light emitting layer between said positive and negative electrode layers;

forming a second resin layer on one of said first and second substrates; and pressing a plate having a convex-and-concave structure on its surface against said second resin layer to produce micro-lenses.

14. A method of producing a light emitting device, according to claim 13, wherein said step of preparing said first resin layer having the convex-and-concave structure disposed on the first substrate includes the step of pressing a mold member having a convex-and-concave structure against the first resin layer to form the structure.

* * * * *

UNITED STATES PATENT AND TRADEMARK OFFICE
CERTIFICATE OF CORRECTION

PATENT NO.    : 6,080,030
DATED         : June 27, 2000
INVENTOR(S)   : KAZUO ISAKA ET AL.

It is certified that error appears in the above-identified patent and that said Letters Patent is hereby corrected as shown below:

ON THE COVER PAGE:

Under Column [56], References Cited, "6275381" should read --6-275381--.

Under Column [75], "Kazuo Isaka; Masao Ueki; Akihiro Mouri; Kazunori Ueno, all of Tokyo, Japan" should read --Kazuo Isaka, Tokyo; Masao Ueki, Urayasu; Akihiro Mouri; Kasunori Ueno, both of Tokyo, all of Japan--.

COLUMN 3

Line 65, "layer" should read --layer 5--.

COLUMN 4

Line 8, "describe" should read --described--; and
Line 29, "the" should read --then--.

UNITED STATES PATENT AND TRADEMARK OFFICE
CERTIFICATE OF CORRECTION

PATENT NO. : 6,080,030

DATED : June 27, 2000

INVENTOR(S) : KAZUO ISAKA ET AL.

It is certified that error appears in the above-identified patent and that said Letters Patent is hereby corrected as shown below:

<u>COLUMN 8</u>

Line 21, "the" (second occurrence) should read -- a--.

Signed and Sealed this

First Day of May, 2001

Attest:

NICHOLAS P. GODICI

Attesting Officer     Acting Director of the United States Patent and Trademark Office